United States Patent
Yamawaki et al.

(10) Patent No.: US 7,333,779 B2
(45) Date of Patent: Feb. 19, 2008

(54) PLL CIRCUIT AND RADIO COMMUNICATION TERMINAL APPARATUS USING THE SAME

(75) Inventors: Taizo Yamawaki, Tokyo (JP); Takefumi Endo, Takasaki (JP); Kazuo Watanabe, Takasaki (JP); Kazuaki Hori, Yokohama (JP); Julian Hildersley, Herts (GB)

(73) Assignees: Renesas Technology Corp., Tokyo (JP); TTPCom Limited, Royston Hertfordshire (GB)

( * ) Notice: Subject to any disclaimer, the term of this patent is extended or adjusted under 35 U.S.C. 154(b) by 443 days.

(21) Appl. No.: 11/121,018

(22) Filed: May 4, 2005

(65) Prior Publication Data

US 2005/0215222 A1    Sep. 29, 2005

Related U.S. Application Data

(60) Continuation of application No. 10/375,241, filed on Feb. 28, 2003, now Pat. No. 6,970,683, which is a division of application No. 09/787,380, filed as application No. PCT/JP99/05012 on Sep. 14, 1999, now Pat. No. 6,996,377.

(30) Foreign Application Priority Data

Sep. 17, 1998    (JP)    ................... 10-262561

(51) Int. Cl.
*H01Q 11/12*    (2006.01)
*H04B 1/04*    (2006.01)

(52) U.S. Cl. .................. 455/118; 455/119; 331/2

(58) Field of Classification Search ........... 455/75, 455/76, 118, 119, 254, 260, 264, 265; 331/1 R, 331/2, 25, 46

See application file for complete search history.

(56) References Cited

U.S. PATENT DOCUMENTS

| 4,510,461 A | 4/1985 | Dickes et al. |
| 4,745,372 A | 5/1988 | Miwa |
| 4,952,889 A | 8/1990 | Irwin et al. |

(Continued)

FOREIGN PATENT DOCUMENTS

EP    0 162 514 A1    11/1985

(Continued)

OTHER PUBLICATIONS

European Search Report dated Feb. 10, 2004.

(Continued)

*Primary Examiner*—Nguyen T. Vo
(74) *Attorney, Agent, or Firm*—Antonelli, Terry, Stout & Kraus, LLP.

(57) ABSTRACT

In a PLL circuit, the number of LPFs is reduced to one to reduce mounting area and pin number, and to simplify design. In one embodiment, the PLL circuit includes a variable-gain phase comparator, a mixer, an LPF, VCOs, couplers, and a control circuit to controlling the on/off operation of the VCOs. The variable-gain phase comparator is capable of varying a phase difference gain. The on/off of the operation of the VCOs is controlled by the control circuit so that one of the VCOs is turned off. The phase difference conversion gain is varied in accordance with the sensitivity of the VCOs so the number of LPFs required for the PLL circuit can be reduced to only one.

1 Claim, 8 Drawing Sheets

U.S. PATENT DOCUMENTS

| | | | |
|---|---|---|---|
| 5,175,729 A | | 12/1992 | Borras et al. |
| 5,359,297 A | | 10/1994 | Hodel et al. |
| 5,568,098 A | | 10/1996 | Horie et al. |
| 5,825,254 A | | 10/1998 | Lee |
| 5,977,806 A | * | 11/1999 | Kikuchi ................ 327/157 |
| 6,163,585 A | | 12/2000 | Yamawaki et al. |
| 6,259,755 B1 | | 7/2001 | O'Sullivan et al. |
| 6,766,178 B1 | | 7/2004 | Damgaard et al. |
| 6,970,683 B2 | * | 11/2005 | Yamawaki et al. ........... 455/86 |
| 6,996,377 B1 | * | 2/2006 | Yamawaki et al. ........... 455/86 |
| 2003/0098745 A1 | * | 5/2003 | Yamashita ................ 331/17 |

FOREIGN PATENT DOCUMENTS

| | | |
|---|---|---|
| EP | 0 906 7044 | 3/1997 |
| EP | 0 856 946 A2 | 8/1998 |
| FR | 2 685 583 A1 | 6/1993 |
| JP | 05-315950 | 11/1993 |
| JP | 09-186587 | 7/1997 |

OTHER PUBLICATIONS

H. Kuroda, et al., Development of Low-Power Consumption RF/IF Single-Chip Transceiver IC for PHS, Compound Semiconductor Device Division, NEC IC Microcomputer Systems, Ltd., pp. 161-167.

* cited by examiner

US 7,333,779 B2

PLL CIRCUIT AND RADIO COMMUNICATION TERMINAL APPARATUS USING THE SAME

This application is a continuation of U.S. application Ser. No. 10/375,241, filed Feb. 28, 2003 now U.S. Pat. No. 6,970,683, which, in turn, is a divisional of U.S. application Ser. No. 09/787,380, filed Jun. 18, 2001 now U.S. Pat. No. 6,996,377; which is a Section §371 of PCT/JP99/05012, filed Sep. 14, 1999, the entire disclosures of which are incorporated herein by reference.

TECHNICAL FIELD

The present invention relates to a technique effectively applicable to a PLL circuit, which converts an IF (intermediate frequency) signal into an RF (radio frequency) signal in a plurality of operation frequency bands, and to a radio communication terminal apparatus using the PLL circuit.

BACKGROUND ART

The present inventors have made the following search and study. More specifically, currently, a great many of radio communication systems exist in the world. For this reason, a terminal usable a plurality of systems has been required. To give an example, there are a GSM (Global System for Mobile communications) and a DCS 1800 (Digital Cellular system 1800). These systems have similar modulation system although an operation frequency band is different.

A PLL circuit has been described in "Phase lock Techniques" (ISBN 0-471-04294-3) section 10.3 published by John Wiley & Sons Company. The PLL circuit converts an IF signal into an RF signal in one operation frequency band. Although the technique shown in FIG. 9 is not known, it shows one example in which the PLL circuit studied by the present inventors is constructed so as to be usable in a plurality of operation frequency bands.

The above PLL circuit comprises a phase comparator 41, a mixer 2, n (n is two or more natural number) low-pass filters (LPF) 42-1 to 42-n, n voltage control oscillators (VCO) 4-1 to 4-n, n couplers 43-1 to 43-n, and a control circuit 6 for controlling the on/off of these VCOs 4-1 to 4-n.

Two signals are inputted to the phase comparator 41. A first input signal is a reference signal IF, and a second input signal is an output signal from the mixer 2. The reference IF signal and the output signal from the mixer 2 is compared in its phase, and then, a signal is outputted in proportional to a phase difference. An output signal from the phase comparator 41 is outputted to the LPFs 42-1 to 42-n so that unnecessary noise is eliminated, and thereafter, is inputted to the VCOs 4-1 to 4-n. The control circuit 6 operates one VCO of the above n VCOs in accordance with a desired operation frequency band, and then, other VCOs are controlled to an off state so as not to output a signal. The output frequencies of the VCOs 4-1 to 4-n are individually fVCO1 to fVCOn, and are inputted to the couplers 43-1 to 43-n. In the coupler, the input signal is outputted after being branched into two. A first output of the coupler is an output signal of the PLL circuit, and a second output thereof is inputted to the mixer 2. Two signals are inputted to the mixer 2, and a first input signal of the mixer is the second output signal of the couplers 43-1 to 43-n. A local oscillator signal RF-LO having a frequency fLO is inputted to the second input of the mixer 2. An output frequency of the mixer 2 is an absolute value of difference between two input frequencies, that is, |fLO−fVCOn|. The output signal of the mixer 2 is the second input signal of the phase comparator 41. Now, if the VCO 4-n is operated, in a state that the PLL circuit is locked, two input frequencies of the phase comparator 41 become equal; for this reason, the input frequency is fIF=|fLO−fVCOn|. Therefore, an output frequency fVCOn of the VCO 4-n is obtained from |fLO−fIF|. Namely, the reference signal frequency fIF to the PLL circuit is converted into fVCOn=|fLO−fIF|.

An operation of the PLL circuit will be analyzed below using a linear model. In this case, the VCO 4-n is selected as the VCO. A phase difference conversion gain of the phase comparator 41 is set as Kd, and a sensitivity of the selected VCO 4-n is set as Kv. Moreover, a lag lead filter is used as the LPF 42-n. Thus, a transfer function F(s) of the LPF 42-n is obtained from the following equation (1).

$$F(s) = \frac{1 + s \cdot C \cdot R2}{1 + s \cdot C \cdot (R1 + R2)} \quad (1)$$

Moreover, an open loop transfer function Ho of the PLL circuit is obtained from the following equation (2).

$$Ho = Kd \cdot Kv \cdot F(s) \quad (2)$$

The pole ωp and zero ωz of the above open loop transfer function Ho are obtained from the following equations (3) and (4), respectively.

$$\omega p = \frac{1}{C \cdot (R1 + R2)} \quad (3)$$

$$\omega z = \frac{1}{C \cdot R2} \quad (4)$$

When the above ωp and ωz are both smaller than a loop band K of the PLL circuit, the loop band K is obtained from the following equation (5).

$$K = Kd \cdot Kv \cdot \frac{R2}{R1 + R2} \quad (5)$$

Therefore, the above loop band K is determined by the aforesaid Kd, Kv, and the transfer function F(s) of the LPF 42-n. The above Kd is a constant; however, in general, the above Kv is different depending upon an operation frequency band. Thus, the characteristics of the LPFs 42-1 to 42-n must be designed in accordance with the above Kv.

By the way, the present inventors have made the study of the aforesaid PLL circuit; as a result, they have found the following matter. More specifically, the aforesaid PLL circuit requires n LPFs for using the plurality of operation frequency bands. In general, the phase comparator is built in an IC; on the other hand, the LPF is mounted outside the IC. For this reason, the number of components mounted outside increases; as a result, a problem arises such that terminal mounting becomes complicate, and the mounting area increases. Further, in the case of using n LPFs, the IC requires n pins corresponding to n LPFs; for this reason, a problem arises such that the number of pins increases. Furthermore, a design must be made with respect to each of n LPFs; for this reason, a problem arises such that the design of LPF becomes complicate.

It is, therefore, an object of the present invention to provide a PLL circuit, which reduces the number of n LPFs required in the above PLL circuit to only one LPF, and thereby, can reduce a mounting area and the number of pins, and can simplify a design, and to provide a radio communication terminal apparatus using the PLL circuit.

The above, other objects and novel features of the present invention will be more apparently understood from the description of this specification and the accompanying drawings.

DISCLOSURE OF THE INVENTION

The following is a brief description on the summary of principal constituent features of the invention disclosed in this application.

More specifically, in order to achieve the above object, the present invention provides a PLL circuit, characterized by comprising: a variable-gain phase comparator outputting a signal proportional to a phase difference between a first input signal and a second input signal, and varying a phase difference gain; a low-pass filter connected to an output terminal of the variable-gain phase comparator; n VCOs connected to an output terminal of the low-pass filter; n couplers connected one by one to an output terminal of the VCOs; a frequency converter connected to each output terminal of n couplers, and converting a frequency of addition signal of the output signal from n couplers so as to output the second input signal; and a control circuit controlling an on-off of operation of n VCOs.

Further, in order to achieve the above object, the PLL circuit is constructed in a manner that the variable-gain phase comparator is replaced with a phase comparator in which a phase difference conversion gain changes by the second signal amplitude, and a variable gain amplifier capable of varying a gain is interposed between the phase comparator and the frequency converter.

Further, in order to reduce an output noise of the PLL circuit, the PLL circuit is constructed in a manner m pieces ("m" is a natural number) of LPFs connected in parallel are connected between the frequency converter and the variable-gain phase comparator, or to the first input of the variable-gain phase comparator, and the PLL circuit further includes a control circuit for controlling an on-off of operation of these m pieces of LPFs connected in parallel.

Moreover, the present invention provides a radio communication terminal apparatus, characterized by comprising: a transmitter system including a quadrature modulator, to which I and Q signals are inputted, a PLL circuit connected to an output terminal of the quadrature modulator, and a power amplifier connected to an output terminal of the PLL circuit; a receiver system outputting I and Q signals; an antenna; and an antenna switch interconnecting the antenna, the transmitter system and the receiver system, the PLL circuit comprising the PLL circuit described above.

The following is a description on the effects obtained by the principal constituent feature of the invention disclosed in this application.

According to the present invention, in the PLL circuit converting an IF signal into an RF signal, it is possible to reduce the number of LPFs required in the case of being used in a plurality of operation frequency bands to only one. Therefore, it is possible to reduce a mounting area and the number of pins of IC including the phase comparator, and thus, to simplify a design of the PLL circuit. As a result, it is possible to reduce the mounting area of a radio communication terminal apparatus such as a cellular phone using the PLL circuit.

BEST MODE FOR CARRYING OUT THE INVENTION

Figure 1:
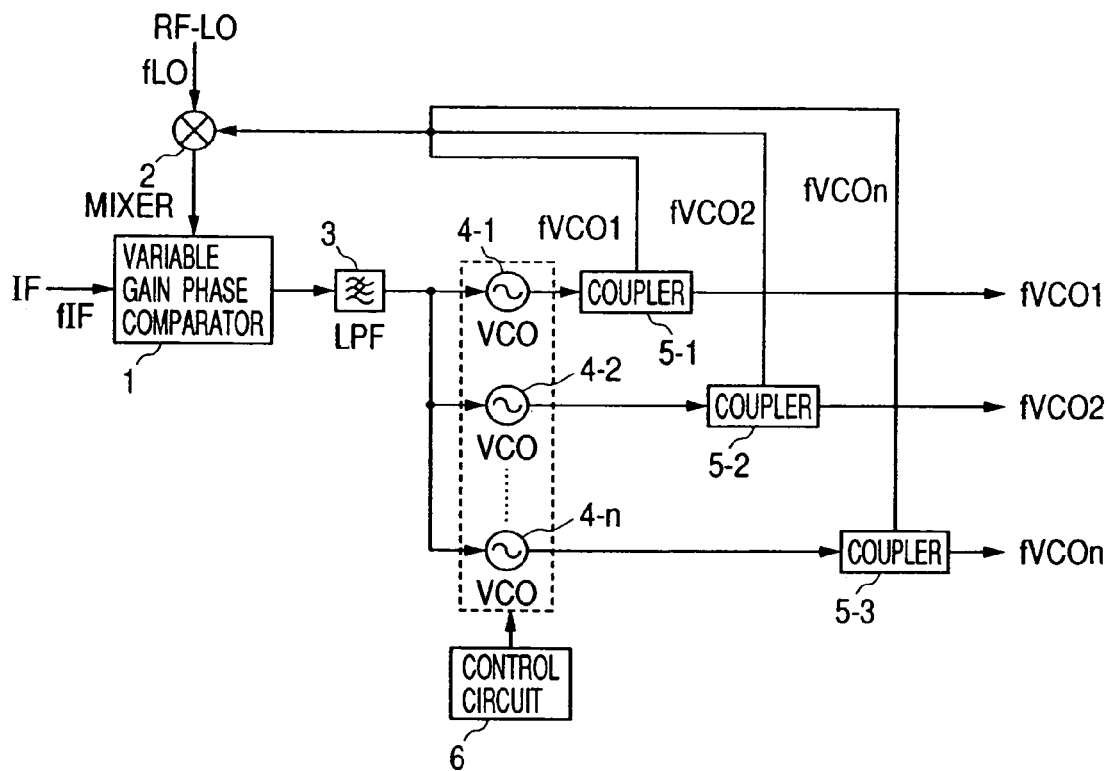
FIG. 1 is a view showing a configuration of PLL circuit according to a first embodiment of the present invention.

The embodiments of the present invention will be described below with reference to the accompanying drawings. In all figures for explaining the embodiments, like reference numerals are used to designate the same components, and the repeated explanation is omitted.

Embodiment 1

FIG. 1 is a view showing a configuration of PLL circuit according to a first embodiment of the present invention.

The PLL circuit of the present invention comprises a variable-gain phase comparator 1, a mixer 2, an LPF 3, n pieces of VCOs 4-1 to 4-n, n pieces of couplers 5-1 to 5-n, and a control circuit 6 for controlling the on/off of the operation of the VCOs.

Two signals are inputted to the variable-gain phase comparator 1. A first input signal is a reference signal IF having a frequency of fIF, and a second input signal is an output signal from the mixer 2. The variable-gain phase comparator 1 compares the reference signal IF with the output signal from the mixer 2 so as to output a signal proportional to a phase difference between these signals. Then, the output signal from the variable-gain phase comparator 1 is inputted to the VCOs 4-1 to 4n after an unnecessary noise is eliminated by the LPF 3. Each output signal of the VCOs 4-1 to 4-n is inputted to one of the couplers 5-1 to 5-n. By the control circuit 6, one of the VCOs 4-1 to 4-n is operated in accordance with a desired operation frequency band; on the other hand, other VCOs are controlled to an off state so as not to output a signal. Each of the couplers 5-1 to 5-n branches the input signal, and then, outputs a signal from two ports. A first output signal of these couplers 5-1 to 5-n is an output signal of the PLL circuit, and a second output signal thereof is inputted to the mixer 2. Two signals are inputted to the mixer 2, and a first input signal of the mixer 2 is the second output signal of the couplers 5-1 to 5-n. A local oscillator signal RF-LO having a frequency fLO is inputted to a second input of the mixer 2. Now, if the VCO 4-n is operated, an output frequency of the mixer 2 is an absolute value of a difference in frequency between the first and second input signals, that is, |fLO−fVCOn|. Thus, the output signal of the mixer 2 becomes a second input signal of the variable-gain phase comparator 1. In a state that the PLL circuit is locked, two input frequencies of the variable-gain phase comparator 1 becomes equal, that is, fIF=|fLO−fVCOn|. Therefore, the output frequency fVCOn of the VCO 4-n is obtained from |fLO−fIF|. In other words, the reference frequency fIF to the PLL circuit is converted into fVCOn=|fLO−fIF|.

Figure 9:
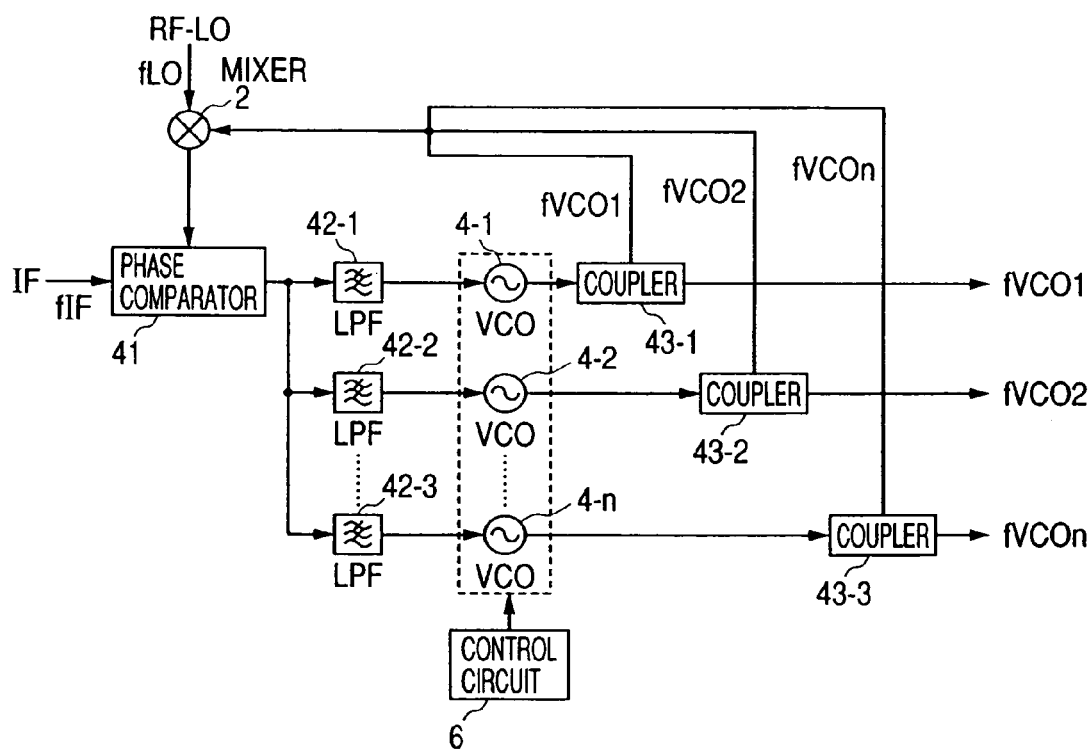
FIG. 9 is a view showing a configuration of conventional PLL circuit recited as the premise of the present invention.

The analysis of the operation of the PLL circuit has been made using a linear model in the same manner as the case of the above-mentioned PLL circuit shown in FIG. 9. In the above equation (5), one LPF 3 is used in the PLL circuit; for this reason, R1 and R2 are a constant. The aforesaid loop band K is determined by the product of the phase difference conversion gain Kd and the sensitivity Kv of the VCO 4-n. Therefore, in accordance with the sensitivity of the VCOs 4-1 to 4-n, the above loop band Kd is varied, and thereby, the optimization of the loop band K can be performed by only one LPF.

Figure 2:
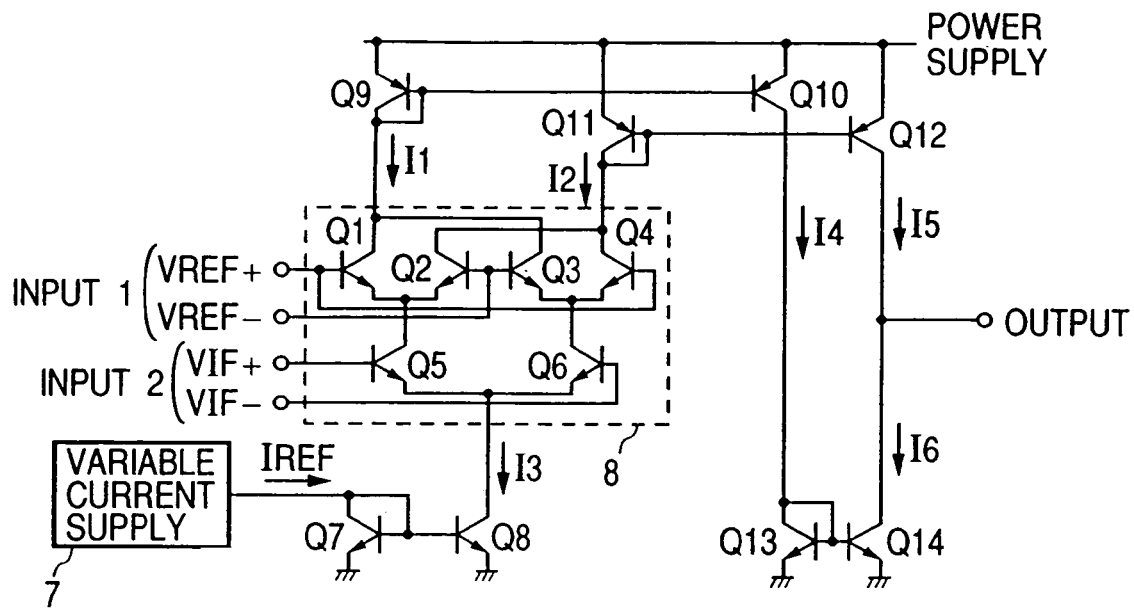
FIG. 2 is a view showing a configuration of variable-gain phase comparator and a variable current source used in the PLL circuit according to the first embodiment of the present invention.

FIG. 2 shows a configuration of the variable-gain phase comparator 1.

The variable-gain phase comparator 1 comprises 14 transistors Q1 to Q14, and a variable current source 7 generating a variable output current IREF. A bipolar transistor is used as these transistors Q1 to Q14. A reference numeral 8 denotes a Gilbert multiplier, and the details are described in "Analog integrated circuit design technology for Ultra SLI (the last volume)", section 10.3 published by Baifukan Company. Differential signals VREF+ and VREF− are inputted to a first input of the Gilbert multiplier 8; on the other hand, differential signals VIF+ and VIF− are inputted to a second input of the same. In the Gilbert multiplier 8, the two differential signals are multiplied so that differential currents I1 and I2 are outputted. The amplitude of two input signals of the Gilbert multiplier 8 is large. Thus, in the case where the transistors Q1 to Q6 make a switching operation, when a collector current of the transistor Q8 is set as I3, a phase difference Φ between the above two input signals and an output differential current (I2−I1) of the Gilbert multiplier 8 are obtained from the following equation (6).

$$I2 - I1 = I3 \cdot \left( \frac{2 \cdot \phi}{\pi} - 1 \right) \tag{6}$$

The transistors Q7 and Q8 constitute a current mirror circuit, and when a current mirror ratio is set as "a", the following relation of I3=a·IREF is formed. Further, the transistors Q9 and Q10 constitute a current mirror circuit, and when a current mirror ratio is set as "b", the following relation of I4=b·I1 is formed. Further, the transistors Q11 and Q12 constitute a current mirror circuit, and when a current mirror ratio is set as "b", the following relation of I5=b·I2 is formed. Further, the transistors Q13 and Q14 constitute a current mirror circuit, and when a current mirror ratio is set as "1", the following relation of I6=I4 is formed. Thus, an output current (I5−I6) of the variable-gain phase comparator 1 is obtained from the following equation (7).

$$I5 - I6 = a \cdot b \cdot IREF \cdot \left( \frac{2 \cdot \phi}{\pi} - 1 \right) \tag{7}$$

Therefore, the phase difference conversion gain Kd of the variable-gain phase comparator 1 is obtained from the following equation (8).

$$Kd = \frac{2 \cdot a \cdot b \cdot IREF}{\pi} \tag{8}$$

In the above equation, "a" and "b" are a constant, and thus, the phase difference conversion gain Kd is proportional to IREF. Therefore, the phase difference conversion gain Kd is variable by varying IREF.

Figure 3:
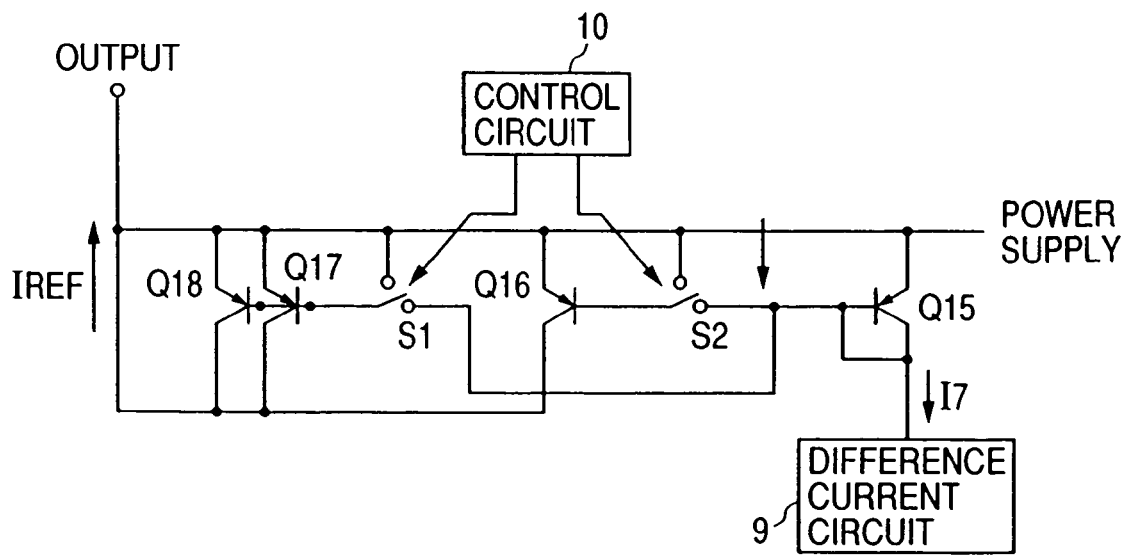
FIG. 3 is a view showing a configuration of variable current source used in the PLL circuit according to the first embodiment of the present invention.

FIG. 3 is a view showing a circuit configuration of the variable current source 7 which can supply two kinds of constant currents having a current value of 1:2.

The variable current source 7 comprises transistors Q15 to Q18, a reference current generating circuit 9 for outputting a constant current, switches S1 and S2, and a control circuit 10 for controlling these switches S1 and S2. The transistors Q15 to Q18 have the same size, and a bipolar transistor is used as these transistors Q15 to Q18. By the switch S1, a base of the transistor Q16 is connected with an emitter of the transistor Q16 or a base of the transistor Q15. Moreover, by the switch S2, a base of the transistor Q17 is connected with an emitter of the transistor Q17 or the base of the transistor Q15, and a base of the transistor Q18 is connected with an emitter of the transistor Q18 or the base of the transistor Q15. These transistors Q16 to Q18 constitute a current mirror circuit together with the transistor Q15. The transistor Q15 is called as an input transistor of the current mirror circuit because a current is inputted thereto from the reference current generating circuit 9; on the other hand, the transistors Q 16 to Q18 are called as an output transistor because they outputs a current from their collectors. When a current supplied from the reference current generating circuit 9 is set as I7, each collect current of the transistors Q16 to Q18 is I7 because these transistors Q15 to Q18 have the same size. In the case where the base of the transistor Q16 is connected to the base of the transistor Q15 and the bases of the transistors Q17 and Q18 are individually connected to the emitters of transistors Q17 and 18, no collector current flows to the transistors Q17 and Q18 because a voltage between base and emitter is 0V. Therefore, the IREF is equal to the collector current of the transistor Q16; namely becomes I7. Moreover, in the case where the base of the transistor Q16 is connected to the emitter of the transistor Q16 and the bases of the transistors Q17 and Q18 are connected to the base of transistors Q15, no collector current flows to the transistor Q16 because a voltage between base and emitter is 0V. Therefore, the IREF is equal to the sum of the collector current of the transistors Q17 and Q18; namely becomes 2·I7.

As described above, by controlling the switches S1 and S2, the variable current source 7 can output two kinds of IREF having a current value of 1:2.

According to this first embodiment, the variable-gain phase comparator 1 capable of varying a phase difference conversion gain is used as a phase comparator of the PLL circuit, and thereby, only one VCO is operated in accordance with a desired operation frequency band. Moreover, the phase difference conversion gain is varied in accordance with the sensitivity of the VCOs 4-1 to 4-n, and thereby, the number of LPF 3 required for the PLL circuit can be reduced to only one. Therefore, it is possible to reduce the number of pins of IC in which the phase comparator is built, and thus, to simplify a design of the PLL circuit.

Embodiment 2

Next, the following is a description on a PLL circuit according to a second embodiment of the present invention.

Figure 4:
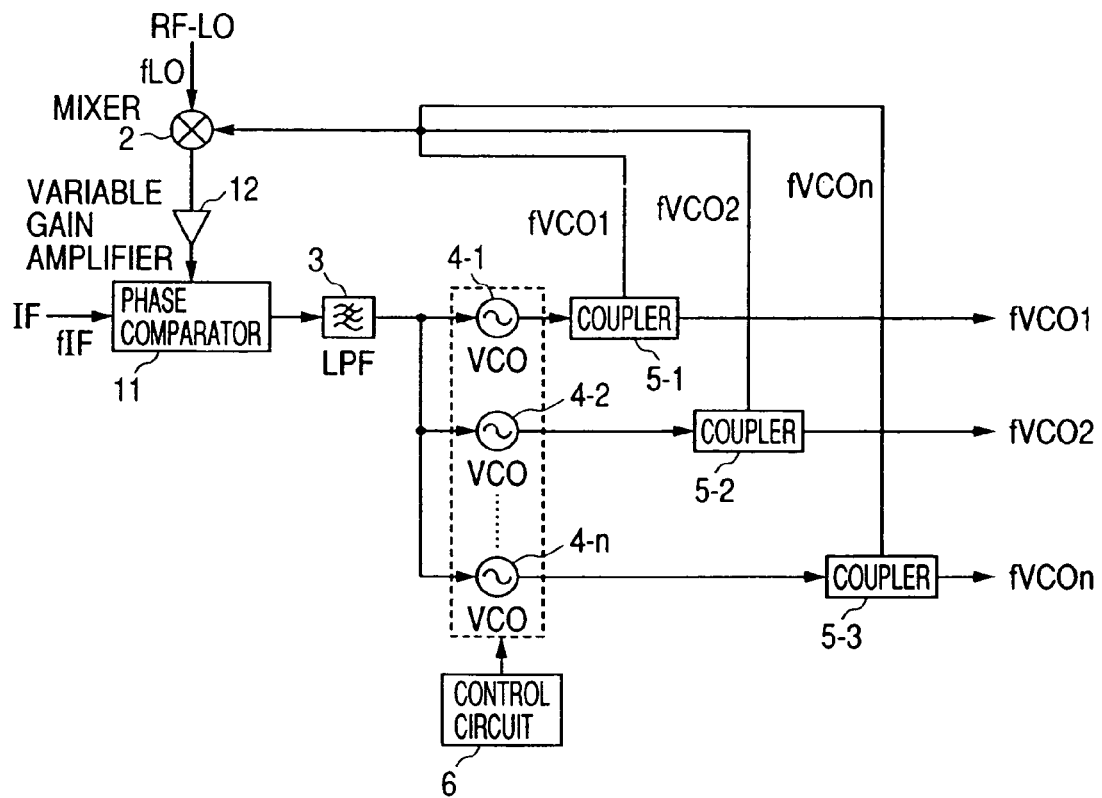
FIG. 4 is a view showing a configuration of PLL circuit according to a second embodiment of the present invention.

FIG. 4 is a view showing a configuration of the PLL circuit according to the second embodiment of the present invention.

The PLL circuit of this second embodiment is constructed as a circuit having the following features. More specifically, a phase comparator 11 varying a gain by input amplitude is used in place of the variable-gain phase comparator 1 used in the first embodiment, and further, a variable gain amplifier 12 is interposed between the mixer 2 and the phase comparator 11. The gain of the variable gain amplifier 12 is controlled in accordance with the sensitivity of the VCOs 4-1 to 4-n, and the input amplitude to the phase comparator 11 is varied so as to change a gain of the phase comparator 11, and thereby, a loop band of the PLL circuit can be optimized.

Figure 5:
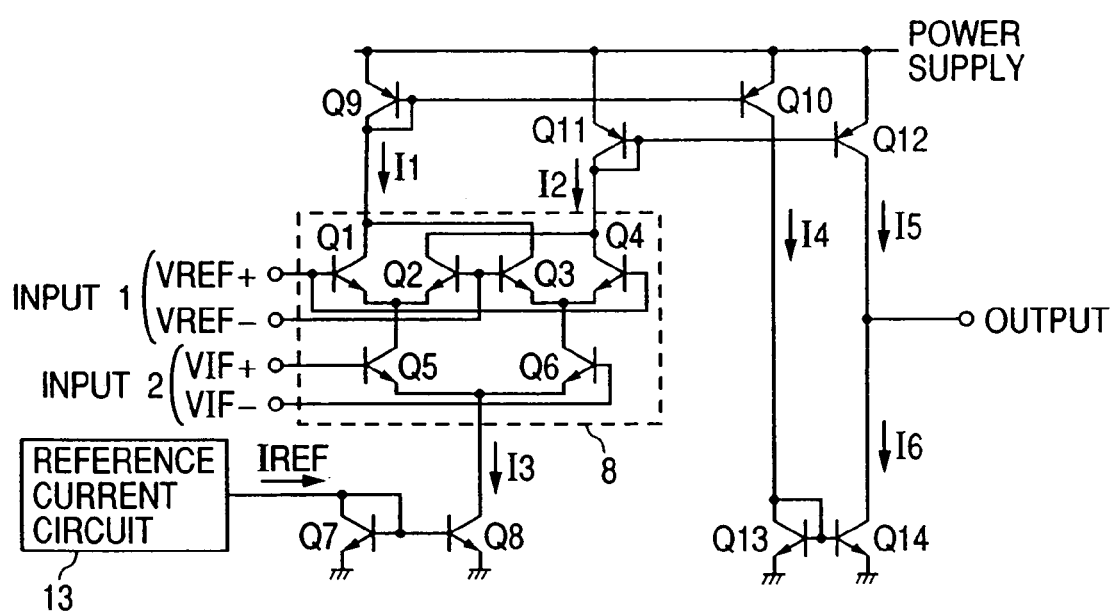
FIG. 5 is a view showing a phase comparator, which can vary a gain by input amplitude in the PLL circuit according to a second embodiment of the present invention.

FIG. 5 is a view showing a configuration of the phase comparator 11.

The phase comparator 11 used in the second embodiment is a circuit having the following features that a reference current generating circuit 13 for outputting a constant current IREF is used in place of the variable constant source 7 of FIG. 2. A bipolar transistor is used as the transistors Q1 to Q14.

The details of operation of the above phase comparator 11 have been described, for example, in the document, A. Bilotti, "Applications of a Monolithic Analog Multiplier," IEEE J. Solid-State Circuits, vol. SC-3, pp. 373-380, December 1968. According to the above document, there are cited the following two ways to change a gain of the phase comparator 11 by input amplitude.

1. The amplitude of inputs 1 and 2 is set smaller than k·T/q so that the transistors Q1 to Q6 make no switching operation.

2. One of the inputs 1 and 2 has amplitude larger than k·T/q so that the transistors Q1 to Q6 make a switching operation, and the other thereof has amplitude smaller than k·T/q so that the transistors Q1 to Q6 make no switching operation. In this case, k is a Boltzmann constant, T is an absolute temperature, and q is a charge of electron.

Therefore, according to this second embodiment, the gain of the variable gain amplifier 12 is controlled in accordance with the sensitivity of the VCOs 4-1 to 4-n so as to change the gain of the phase comparator 11. By doing so, like the above first embodiment, the number of LPF 3 required for the PLL circuit can be reduced to only one. Therefore, it is possible to reduce the number of pins of IC in which the phase comparator 11 is built, and thus, to simplify a design of the PLL circuit.

Embodiment 3

Next, the following is a description on a PLL circuit according to a third embodiment of the present invention.

Figure 6:
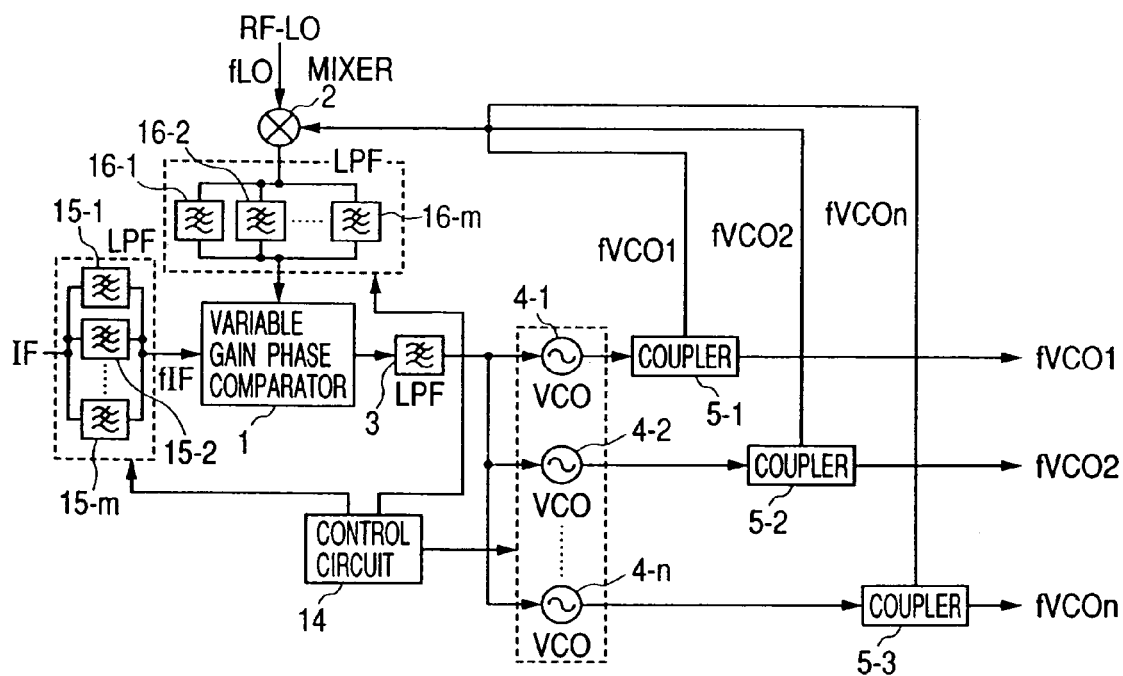
FIG. 6 is a view showing a configuration of PLL circuit according to a third embodiment of the present invention.

FIG. 6 is a view showing a configuration of the PLL circuit according to the third embodiment of the present invention.

The PLL circuit of this third embodiment is a circuit having the following features. More specifically, LPFs 16-1 to 16-m connected in parallel are interposed between the variable-gain phase comparator 1 and the mixer 2 used in the above first embodiment, and LPFs 15-1 to 15-m connected in parallel are connected to the first input of the variable-gain phase comparator 1. Further, a control circuit 14 for controlling the on-off of the VCOs 4-1 to 4-n, LPFs 15-1 to 15-m, and LPFs 16-1 to 16-m is used in place of the control circuit 6.

These LPFs 15-1 to 15-m and LPFs 16-1 to 16-m are used for eliminating a noise inputted to the variable-gain phase comparator 1. Moreover, the reference signal IF has m-way frequencies fIF. The control circuit 14 selects one LPF having the optimal cut-off frequency to fIF from the respective LPFs 15-1 to 15-m. Likewise, the control circuit 14 selects one LPF having the optimal cut-off frequency to fIF from the respective LPFs 16-1 to 16-m.

Next, the following is a description on a radio communication terminal apparatus using the PLL circuit according to the present invention.

Figure 7:
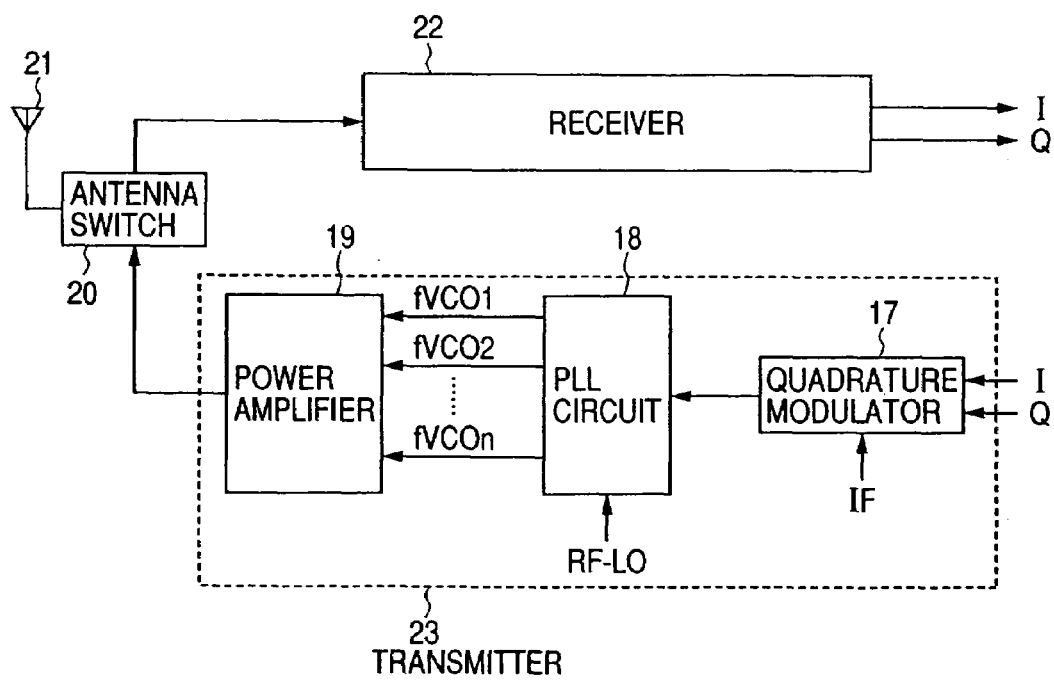
FIG. 7 is a view showing a configuration of radio communication terminal apparatus using the PLL circuit of the present invention.

FIG. 7 is a view showing a configuration of the radio communication terminal apparatus using the PLL circuit of the present invention.

The radio communication terminal apparatus of the present invention comprises a transmitter system including a quadrature modulator 17, the PLL circuit 18 and a power amplifier 19; an antenna switch 20; an antenna 21; and a receiver system 22.

In the quadrature modulator 17, the IF signal is modulated by I and Q signals. An output signal from the quadrature modulator 17 is inputted as a reference signal to the PLL circuit 18. The reference signal and a RF-LO signal are inputted to the PLL circuit 18, and then, one of frequencies fVCO1 to fVCOn is outputted as an output signal frequency. The output signal of the PLL circuit 18 is amplified in its power by the power amplifier 19, and thereafter, is transmitted from the antenna 21 via the antenna switch 20. In transmitting, only antenna 21 and transmitter system 23 are connected by the antenna switch 20; on the other hand, in receiving, only antenna 21 and receiver system 22 are connected. A signal received by the antenna 21 is inputted to the receiver system 22 via the antenna switch 20, and then, is demodulated so that the signals I and Q are outputted.

Next, a detailed example of the radio communication terminal apparatus of the present invention will be described below.

Figure 8:
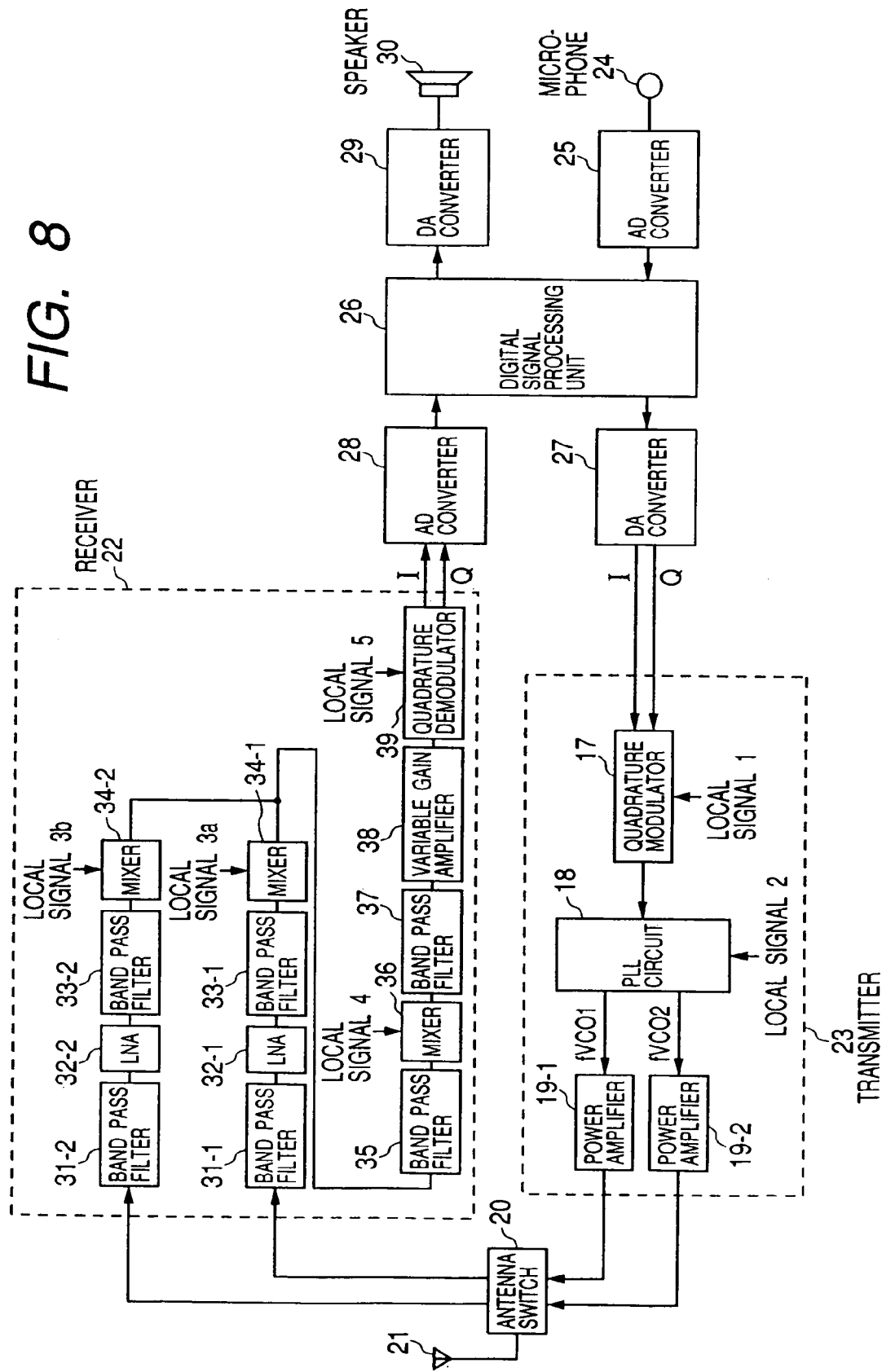
FIG. 8 is a view showing a configuration of cellular phone used as the radio communication terminal apparatus using the PLL circuit of the present invention.

FIG. 8 is a view showing a configuration of cellular phone used as the radio communication terminal apparatus of the present invention.

The cellular phone of the present invention has a circuit configuration in the case of using two frequency bands (communication methods). The cellular phone comprises a microphone 24, a transmitter side A-D converter 25, a digital signal processing unit 26 used in common to reception and transmission, a transmitter side D-A converter 27, the transmitter system 23, the antenna switch 20, the receiver system 22, a receiver side A-D converter 28, a receiver side D-A converter 29, and a speaker 30.

The transmitter system 23 is provided with two power amplifiers 19-1 and 19-2 corresponding to two frequency bands. The frequency fVCO1 and fVCO2 signals outputted from the PLL circuit 18 are amplified in its power by the power amplifiers 19-1 and 19-2, respectively, and thereafter, are outputted. These power amplifiers 19-1 and 19-2 have the same function as the power amplifier 19 described before. Moreover, a local oscillation signal 1 (IF) is inputted to a quadrature modulator 17, and a local oscillator signal 2 (RF-LO) is inputted to the PLL circuit 18, and these modulator and PLL circuit have the same function as described above.

The receiver system 22 is provided with two band-pass filters 31-1 and 32-2, LANs 32-1 and 32-2, pass-band filters 33-1 and 33-2, mixers 34-1 and 34-2; a common pass-band filter 35 after mixing; a mixer 36; a pass-band filter 37; a variable gain amplifier 38, and a quadrature demodulator 39. More specifically, local oscillator signals 3a and 3b are inputted to mixers 34-1 and 34-2, respectively, and a local oscillator signal 4 is inputted to the mixer 36, and further, a local oscillator signal 5 is inputted to the quadrature demodulator 39.

In the receiver system 22, each of the mixers 34-1, 34-2 and 36 outputs the result multiplying two input signals, and thereby, frequency conversion can be performed. The local oscillator signal inputted to each of these mixers 34-1, 34-2 and 36 is a signal having a stable frequency outputted from a PLL synthesizer. The PLL synthesizer uses an output signal of crystal oscillator as a reference signal, and thereby, the output frequency can be stabilized. The band-pass filters 31-1, 31-2, 33-1, 33-2, 35 and 37 are a filter for passing only specified frequency band. In general, a dielectric filter is used as the band-pas filters 31-1 and 31-2, and a SAW filter is used as the band-pass filters 33-1, 33-2 and 35, and further, an LC filter is used as the band-pass filter 37. The variable gain amplifier 38 is an amplifier for changing a gain by a control signal from the digital signal processing unit 26, and there are an analog type amplifier and a digital type amplifier. Each of the LANs 32-1 and 32-2 is an amplifier, which has almost no noise, and comprises one transistor and a bias circuit, in general.

In the above cellular phone, in transmitting, a voice (speech) is inputted through the microphone 24, and then, an analog signal from the microphone 24 is converted into a digital signal by the A-D converter 25 so that the digital signal is processed by the digital signal processing unit 26. Further, the digital signal from the digital signal processing unit 26 is converted into an analog signal by the D-A converter 27, and thereafter, the analog signal is outputted to the transmitter system 23. Then, in the transmitter system, 23, the same operation as described before is made, and a signal amplified by one of the power amplifiers 19-1 and 19-2 is transmitted from the antenna 21 via the antenna switch 20.

Moreover, in receiving, a signal received by the antenna 21 is inputted to the receiver system 22 via the antenna switch 20. Thereafter, the signal is passed through the path of the band-pass filter 31-1, the LAN 32-1, the band-pass filter 33-1 and the mixer 34-1 or the path of the band-pass filter 31-2, the LAN 32-2, the band-pass filter 33-2 and the mixer 34-2. Further, filtering, amplification and mixing are repeated are filtered by the band-pass filter 35, the mixer 36 and the band-pass filter 37, and then, the signal is demodulated by the variable gain amplifier 38 and the quadrature demodulator 39, and thereafter, the signals I and Q are outputted from the receiver system 22. Then, an analog signal from the receiver system 22 is used as input, and the analog signal is converted into a digital signal by the A-D converter 28. Further, the digital signal is processed by the digital signal processing unit 26, and then, the digital signal from the digital signal processing unit 26 is converted into an analog signal by the D-A converter 29, and thereafter, the analog signal is outputted as a voice via the speaker 30.

Therefore, according to this third embodiment, the variable-gain phase comparator 1 is used as the phase comparator of the PLL circuit, and thereby, one VCO is operated in accordance with a desired operation frequency band. Moreover, the phase difference conversion gain is changed in accordance with the sensitivity of the VCOs 4-1 to 4-n, and thereby, like the above first embodiment, the number of LPF 3 required for the PLL circuit can be reduced to only one. Therefore, it is possible to reduce the number of pins of IC in which the phase comparator is built, and thus, to simplify a design of the PLL circuit. In addition, it is possible to eliminate a noise inputted to the variable-gain phase comparator 1 by the LPFs 15-1 to 15-n and 16-1 to 16-n. In the case where the PLL circuit is applied to a radio communication terminal apparatus such as a cellular phone or the like, it is possible to reduce a mounting area of the radio communication terminal apparatus.

The invention made by the inventors has been described based on the above embodiments. The present invention is not limited to the above embodiments, and various modifications and changes may be possible within a range of scope without diverging the gist of the invention.

For example, the above embodiment has described the case where the frequency converter of the PLL circuit comprises a mixer circuit having two inputs. The frequency converter may comprise a divider circuit in place of the mixer circuit. In this case, an addition signal of the output signal from the coupler is used as input, and then, an output of the addition signal is inputted to the variable-gain phase comparator.

Further, a bipolar transistor has been used as the transistor of the circuit element in FIG. 2, FIG. 3 and FIG. 5. Another kind of transistor, for example, a MOSFET transistor may be used; in this case, the same function as the bipolar transistor can be realized.

Furthermore, the cellular phone shown in FIG. 8 has a circuit configuration of the case of using two frequency bands. The power amplifier, band-pass filter, LAN, mixer are connected in parallel, and thereby, it is possible to provide a circuit configuration capable of using many frequency bands.

INDUSTRIAL APPLICABILITY

As is evident from the above description, the present invention provides a PLL circuit, which can convert an IF (intermediate frequency) signal into an RF (radio frequency) in a plurality of operation frequency bands. In the PLL circuit, the number of LPF required for the PLL circuit is reduced to only one, and thereby, it is possible to reduce the mounting area and the number of pins, and thus, to simplify a design of the PLL circuit. Further, the present invention is widely applicable to a radio communication terminal apparatus including a cellular phone using the PLL circuit, etc.

What is claimed is:

1. A radio communication circuitry, to be used in a radio communication terminal apparatus, comprising:

transmitting circuitry including a transmitting modulator to which transmitting I and Q base band signals and a transmitting intermediate frequency local signal are supplied and a phase locked loop circuit to which a modulated output signal from an output node of said transmitting modulator and a transmitting radio frequency local signal are supplied;

receiving circuitry receiving a radio frequency input signal received by an antenna of said radio communication terminal apparatus and outputting received I and Q base band signals, wherein said transmitting modulator of said transmitting circuitry outputs a transmitting intermediate frequency transmitting output signal, wherein an output terminal of said phase locked loop circuit is adapted to be coupled to an input terminal of a radio frequency power amplifier, an output terminal of which is adapted to be coupled to said antenna of said radio communication terminal apparatus, wherein said phase locked loop circuit of said transmitting circuitry comprises:

a phase comparator to output a signal related to a phase difference between said transmitting intermediate frequency transmitting output signal and a feedback intermediate frequency signal, a frequency of which is converted from a frequency of said transmitting radio frequency transmitting output signal by a frequency conversion circuit;

a low-pass filter, an input of which is coupled to an output terminal of said phase comparator; and a frequency generator, including a controlled oscillator, an input terminal of which is coupled to an output terminal of said low-pass filter and an output terminal of which is adapted to generate a plurality of oscillating signals of a plurality of frequency bands;

wherein selected ones of said plurality of frequencies oscillating signals generated by said frequency generator originates said frequency of said transmitting radio frequency transmitting output signal, and wherein said phase comparator of said phase locked loop circuit of said transmitting circuitry is so controlled that a parameter of a product of a sensitivity between a frequency of an oscillating output signal and a control input signal of said frequency generator and a gain between an output signal and an input phase difference of said phase comparator is almost constant even when said selected one of said plurality of frequencies oscillating signals generated by said frequency generator is assigned to any one of said plurality of oscillating signals of said plurality of frequency bands.

* * * * *